(12) United States Patent
Abdul Razak et al.

(10) Patent No.: US 11,915,986 B2
(45) Date of Patent: Feb. 27, 2024

(54) CERAMIC SEMICONDUCTOR DEVICE PACKAGE WITH COPPER TUNGSTEN CONDUCTIVE LAYERS

(71) Applicant: Texas Instruments Incorporated, Dallas, TX (US)

(72) Inventors: Ramlah Binte Abdul Razak, Plano, TX (US); Hector Torres, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/683,308

(22) Filed: Feb. 28, 2022

(65) Prior Publication Data
US 2023/0274989 A1   Aug. 31, 2023

(51) Int. Cl.
*H01L 23/047* (2006.01)
*H01L 23/367* (2006.01)
*H01L 21/48* (2006.01)

(52) U.S. Cl.
CPC ........ *H01L 23/047* (2013.01); *H01L 21/4807* (2013.01); *H01L 21/4817* (2013.01); *H01L 23/367* (2013.01)

(58) Field of Classification Search
CPC ............... H01L 23/047; H01L 21/4807; H01L 21/4817; H01L 23/367
USPC ....................................................... 257/707
See application file for complete search history.

(56) References Cited

U.S. PATENT DOCUMENTS

| | | | | |
|---|---|---|---|---|
| 5,622,588 A | * | 4/1997 | Weber ................. | H05K 1/021 29/830 |
| 6,324,067 B1 | * | 11/2001 | Nishiyama ............ | H05K 1/183 428/209 |
| 6,625,028 B1 | * | 9/2003 | Dove .................... | H01L 23/552 257/659 |
| 2007/0262387 A1 | * | 11/2007 | Nonaka ................ | H01L 23/057 257/E23.106 |
| 2013/0189935 A1 | * | 7/2013 | Nair ...................... | H01Q 1/38 343/700 MS |
| 2015/0303881 A1 | * | 10/2015 | Blednov ............... | H03F 1/086 330/289 |
| 2021/0384092 A1 | * | 12/2021 | Raben .................. | H01L 23/544 |

\* cited by examiner

OTHER PUBLICATIONS

"Design Guidelines", AdTech Ceramics, Datasheet, 2016, retrieved from the world wide web with uniform resource locator (url): http://www.adtechceramics.com/assets/pdf/AdTech-Ceramics-Design-Guide-Capabilities.pdf on Feb. 28, 2022.

*Primary Examiner* — Duy T Nguyen
(74) *Attorney, Agent, or Firm* — John Pessetto; Frank D. Cimino

(57) ABSTRACT

A described example includes: a ceramic package having a board side surface and an opposite top side surface; a heat slug mounted to the board side surface of the ceramic package, forming a bottom surface in a die cavity; leads mounted to conductive lands on the ceramic package; sidewall metallization extending from the conductive lands and covering a portion of one of the sides of the ceramic package; copper tungsten alloy conductor layers formed in the ceramic package and spaced by dielectric layers; bond fingers formed of a conductor layer and extending to the die cavity; a semiconductor device mounted over the heat slug, and having bond pads on a device side surface facing away from a surface of the heat slug; electrical connections between bond pads on the semiconductor device and the bond fingers; and a lid mounted to the top side surface of the ceramic package.

13 Claims, 7 Drawing Sheets

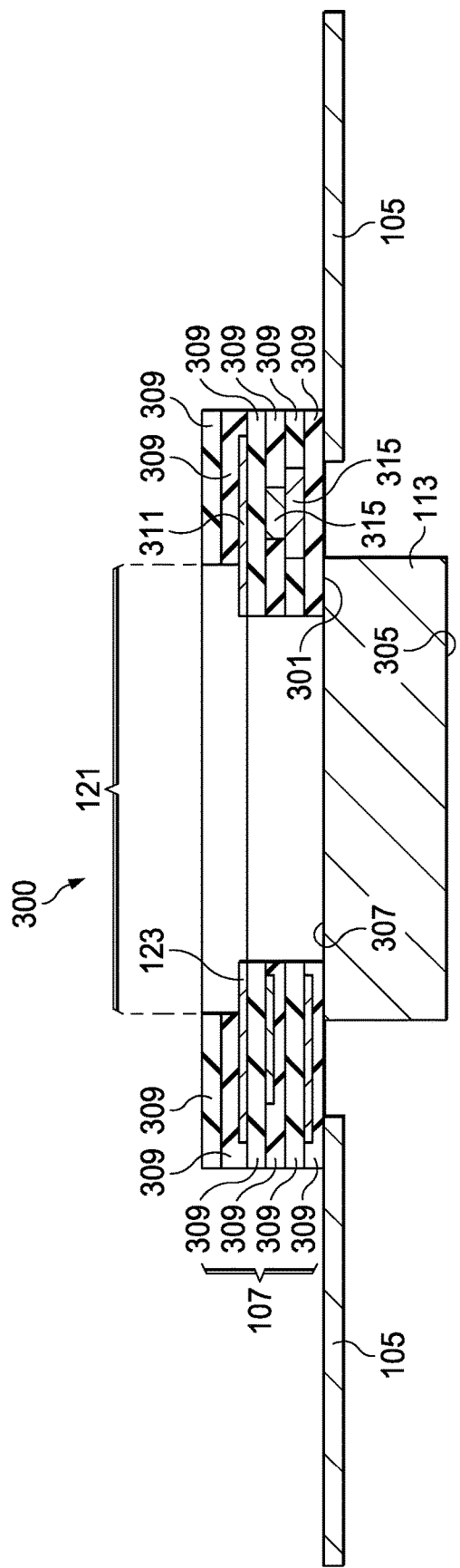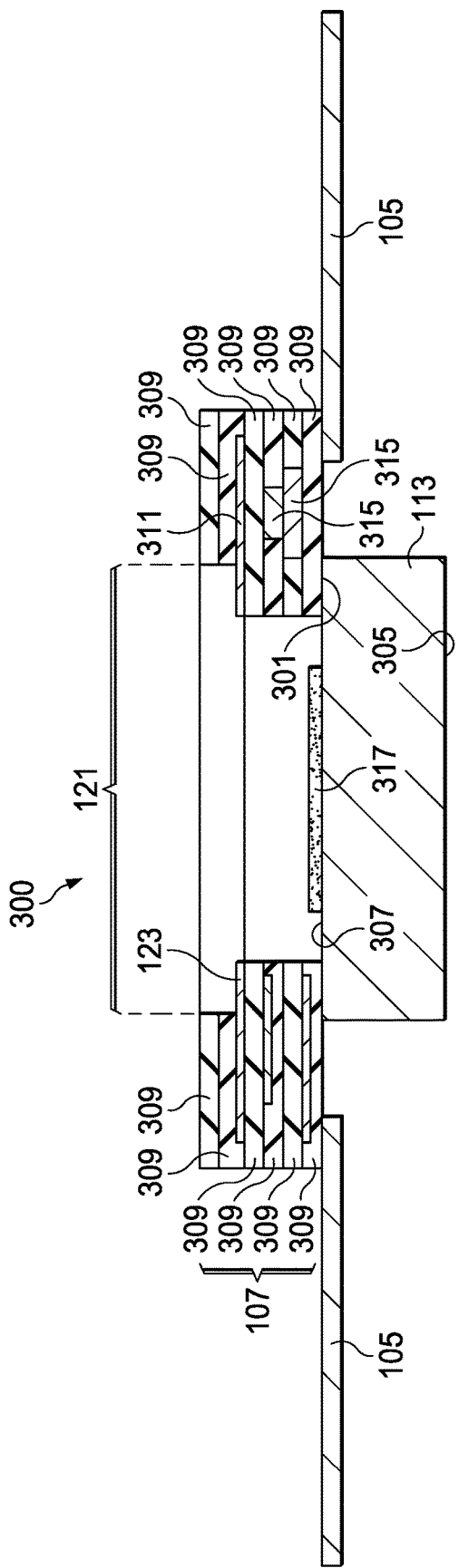

CERAMIC SEMICONDUCTOR DEVICE PACKAGE WITH COPPER TUNGSTEN CONDUCTIVE LAYERS

TECHNICAL FIELD

This relates generally to packaging electronic devices, and more particularly to ceramic semiconductor device packages.

BACKGROUND

Processes for producing semiconductor device packages include mounting a semiconductor device to a ceramic package substrate. Ceramic package substrates provide good electrical isolation and low thermal coefficients for high performance, and can be used for high power semiconductor devices. Ceramic semiconductor device packages can provide hermetic sealed packages to protect the semiconductor devices from moisture and stress. The ceramic package substrate can include a ceramic package body formed of laminated layers of ceramic material with horizontal conductors formed as layers spaced apart by layers of the ceramic dielectric material. To connect conductors between horizontal layers, vertical filled vias are formed extending through the layers of ceramic material between horizontal conductor layers to electrically couple the conductors. Ceramic semiconductor device packages are used for power semiconductor devices that can carry high current and high voltage signals. Applications include power transistor devices such as power field effect transistors (power FETs) arranged to deliver current or voltage to a load. An important characteristic for the ceramic semiconductor device packages is the resistance of the internal conductors. Improvements in ceramic semiconductor device packages are needed.

SUMMARY

A described example includes: a ceramic package having a board side surface and an opposite top side surface; a heat slug mounted to the board side surface of the ceramic package, forming a bottom surface in a die cavity; leads mounted to conductive lands on the ceramic package; sidewall metallization extending from the conductive lands covering a portion of one of the sides of the ceramic package; copper tungsten conductor layers formed in the ceramic package and spaced by dielectric layers; bond fingers formed of a conductor layer and extending to the die cavity; a semiconductor device mounted over the heat slug, and having bond pads on a device side surface facing away from a surface of the heat slug; electrical connections between bond pads on the semiconductor device and the bond fingers; and a lid mounted to the top side surface of the ceramic package.

Another described example includes a ceramic package having a board side surface and an opposite top side surface, and a first side, a second side, a third side and a fourth side, the first, second, third and fourth sides extending between the board side surface and the opposite top side surface. A heat slug having a board side surface and an opposite top side surface is mounted to the board side surface of the ceramic package, a surface of the heat slug covering a die cavity formed in the ceramic package and forming a bottom surface in the die cavity. Leads are mounted to conductive lands on the board side surface of the ceramic package, the leads having a flat surface attached to the conductive lands; with sidewall metallization extending from the conductive lands on the board side surface and covering a portion of one of the first, second, third and fourth sides of the ceramic package. Conductor layers are formed in the ceramic package and spaced by dielectric layers in the ceramic package, the conductor layers are of a copper tungsten alloy, the conductor layers forming horizontal conductors within the ceramic package/Filled vias extend through the dielectric layers between the conductor layers, and electrically couple some of the conductor layers. Bond fingers formed of a conductor layer extend to the die cavity, the bond fingers having an exposed surface. At least one semiconductor device has a backside surface mounted to the top side surface of the heat slug, the at least one semiconductor device having bond pads on a device side surface facing away from the top side surface of the heat slug. Electrical connections couple bond pads of the at least one semiconductor device to the exposed surface of the bond fingers; and a lid mounted to the opposite top side surface of the ceramic package covers the die cavity, the at least one semiconductor device and the electrical connections.

A method is described that includes: mounting a semiconductor device in a die cavity of a ceramic package of a ceramic package substrate, the ceramic package substrate including conductive leads mounted to conductive lands on a board side surface, the conductive lands connected to sidewall metallization on a first, second, third or fourth side of the ceramic package that extend from the board side surface to a top side surface of the ceramic package, the ceramic package comprising copper tungsten alloy conductor layers spaced by dielectric material and filled vias coupling the copper tungsten alloy conductor layers. The method includes forming electrical connections by wire bonding or ribbon bonding between bond pads on the semiconductor device and bond fingers of the ceramic package, the bond fingers formed of one of the conductor layers and having an exposed surface next to the die cavity. The die cavity is sealed by mounting a lid to the top side surface of the ceramic package, the lid covering the die cavity, the semiconductor device and the electrical connections.

BRIEF DESCRIPTION OF THE DRAWINGS

FIGS. 3A-3E illustrate, in a series of cross sectional views, the results of selected steps in manufacturing a packaged semiconductor device of the arrangements.

DETAILED DESCRIPTION

Figure 1A:
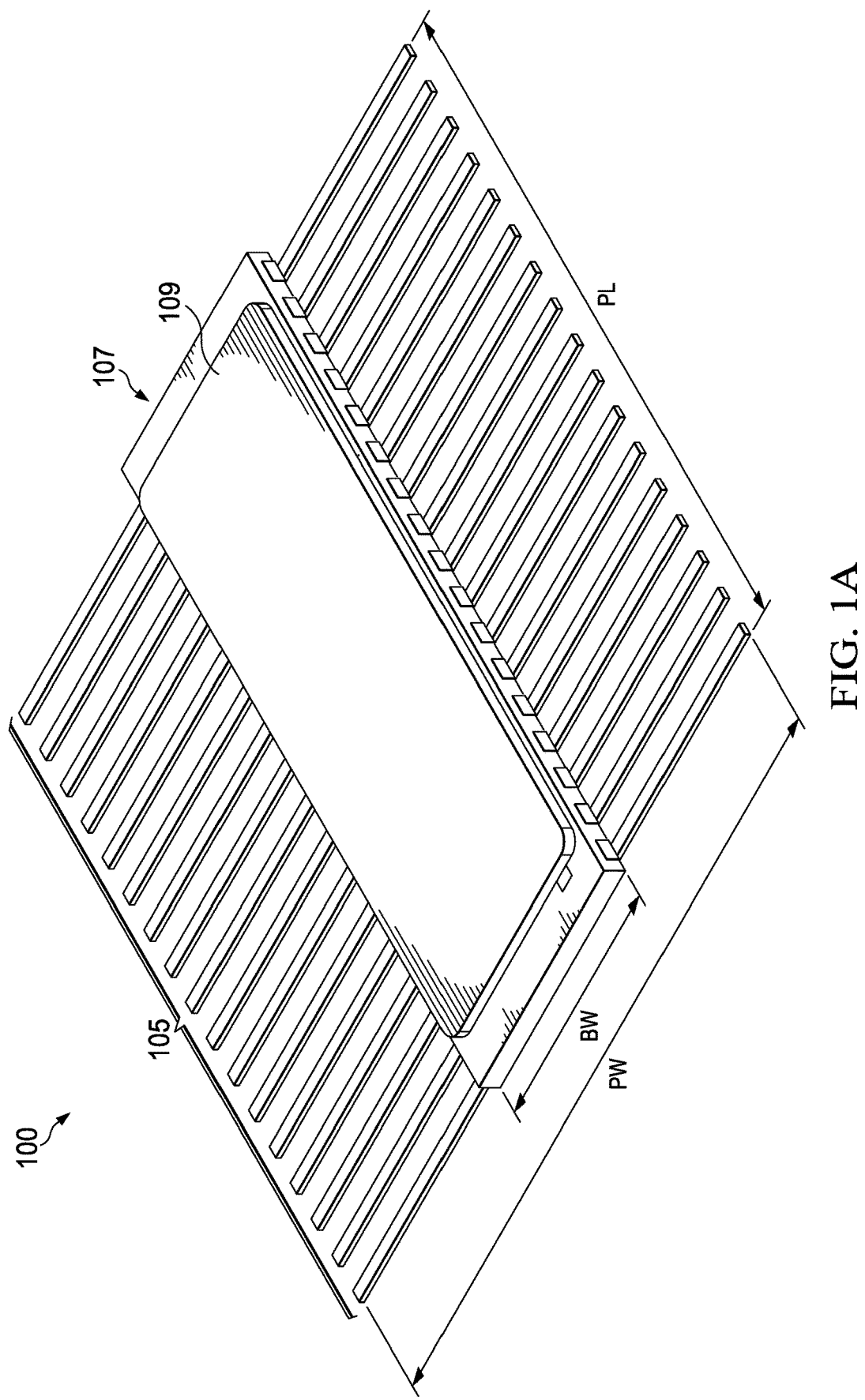
FIG. 1A illustrates in a projection a top view of a ceramic semiconductor device package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor device" is used herein. A semiconductor device can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an AID converter. The semiconductor device can include passive devices such as resistors, inductors, filters, sensors, or active devices such as transistors. The semiconductor device can be an integrated circuit with hundreds or thousands of transistors coupled to form a functional circuit, for example a microprocessor or memory device.

The term "ceramic semiconductor device package" is used herein. A semiconductor device package has at least one semiconductor device electrically coupled to terminals, and has a ceramic package body that protects and covers the semiconductor device. In some arrangements, multiple semiconductor devices can be packaged together. For example, a power field effect transistor (FET) semiconductor device and a second semiconductor device (such as a passive component, a gate driver die or a controller die) can be packaged together to from a single packaged electronic device. Additional electrical components such as passives can be included in the packaged electronic device. The semiconductor device is mounted with a ceramic package substrate that provides conductive leads, a portion of the conductive leads form the terminals for the packaged device. In wire bonded ceramic semiconductor device packages, bond wires couple bond fingers of a ceramic package substrate to bond pads on the semiconductor device. The ceramic semiconductor device package can have a package body formed by a laminated structure of multiple layers of a ceramic material, with layers of conductors formed on the ceramic materials, and electrical connections between the layers of conductors formed by filled vias extending through the layers of ceramic material. A thermoset epoxy resin mold compound can be used to cover the semiconductor devices. An inert gas can be used to fill a die cavity where the semiconductor devices are positioned in the ceramic package body. The ceramic package body can be sealed and may provide a hermetic package for the semiconductor device. The leads can be used to mount the ceramic semiconductor device package to a circuit board using solder or by use of a surface mount technology (SMT).

The term "ceramic package substrate" is used herein. A ceramic package substrate is a substrate arranged to receive at least one semiconductor device and to support the semiconductor device in a ceramic semiconductor device package. Ceramic package substrates useful with the arrangements include a ceramic package mounted to the leads of a conductive lead frame. The lead frames can be formed from copper, aluminum, stainless steel, steel, alloys such as Alloy 42 or other iron nickel alloys, iron nickel cobalt alloys such as Kovar, and copper alloys. The lead frames can include the ceramic package mounted to leads for receiving a semiconductor device, and can include a heat slug or thermal pad, and conductive leads are attached to metal lands on the exterior of the ceramic package body. The metal lands are coupled through conductor layers within the ceramic material to bond fingers placed next to a die cavity for receiving the semiconductor device. The bond fingers are arranged for coupling to bond pads on the semiconductor die using electrical connections formed by wire bonds, ribbon bonds, or other conductors. In example arrangements, a heat slug is attached to a ceramic package, a surface of the heat slug forming the bottom of a die cavity in the ceramic package, the heat slug having a die mounting area for mounting semiconductor devices. The ceramic package substrates can be provided singly, in strips or in two dimensional arrays. Semiconductor devices can be placed in die cavities within respective unit device portions within the strips or arrays. A semiconductor device can be placed on a die mount area in a die cavity for each packaged semiconductor device, and die attach or die adhesive can be used to mount the semiconductor devices. In wire bonded packages, bond wires can couple bond pads on the semiconductor devices to the bond fingers of the ceramic packages. After the bond wires are in place, a portion of the ceramic package and the die cavity including the semiconductor device are covered by attaching a lid to a top side surface of the ceramic package, sealing the ceramic packaged device. More than one semiconductor device can be mounted to a ceramic package substrate for each unit. The ceramic semiconductor device packages can be hermetically sealed to protect the semiconductor devices from moisture, dust and shock.

The term "power FET" is used herein. As used herein, a power FET is field effect transistor (FET) device arranged to carry current between a drain and a source terminal, and the power FET is capable of carrying higher currents, such as several amperes. The power FET can be a silicon, silicon carbide (SiC), or gallium nitride (GaN) FET device. Power FETs are used, for example, in switching power applications such as up and down voltage level converters. Semiconductor packages for power semiconductor particularly important to performance. Resistance of the connections in the package can be of particular importance to device performance.

The term "heat slug" is used herein. A heat slug is a piece of thermally conductive material. In the arrangements, the heat slug is integral to a ceramic semiconductor device package, and semiconductor devices are mounted to a surface of the heat slug to be in thermal contact with the heat slug. In example arrangements, a heat slug has a board side surface, and an opposite top side surface that forms the bottom surface of a die cavity extending through a ceramic package body. Because of the materials used and the exposed board side surface, the heat slug can efficiently dissipate thermal energy, and in some examples the board side surface of the ceramic semiconductor device package can be soldered to a thermal pad on a printed circuit board to enhance thermal dissipation. In examples the heat slug can be of copper, an alloy, copper tungsten, or aluminum, and may have platings to reduce corrosion or prevent tarnish, protective platings such as palladium, nickel, and gold can be used, or combinations of these can be used.

In packaging semiconductor devices, a ceramic package may be provided. A semiconductor device, or multiple semiconductor devices, can be mounted in a die cavity in the ceramic package. The ceramic package can be sealed using a lid that is brazed or soldered to a seal ring on a top side of the ceramic package. The ceramic package can be hermetically sealed to protect the semiconductor devices within from moisture, dust, and shock.

Leads for leaded ceramic semiconductor device packages are arranged for solder mounting to a circuit board. The leads can be shaped to extend towards the board, and form a mounting surface. Gull wing leads, J-leads, and other lead shapes can be used. In a ceramic flat package (CFP), the leads can be straight and are brazed to metallization patterns on the exterior of the ceramic package. In example arrangements, the leads are brazed to metal lands formed on a board side surface of the ceramic package. The leads can then be used to surface mount the packaged semiconductor device to a printed circuit board. Conductors within the ceramic package form electrical connections between the metal lands and to the semiconductor devices within the package.

In the arrangements, a ceramic semiconductor device package includes at least one semiconductor device mounted to a heat sink or heat slug that forms a bottom portion of a die cavity. The die cavity is an opening in a ceramic package substrate. The heat slug is attached to the board side surface of the ceramic package. A ceramic package substrate is formed with the ceramic package and conductive leads extending from the ceramic package. The ceramic package substrate has the leads attached by solder or brazing that are provided as part of a conductive lead frame. The heat slug is a thermally conductive solid material such as copper, a copper alloy, copper tungsten alloy, or aluminum. In an example arrangement, a ceramic package substrate includes a ceramic package mounted to leads of a lead frame with leads mounted on two sides of the ceramic package. The leads can be Alloy 42, iron nickel alloys, Kovar or iron nickel cobalt alloys. The ceramic semiconductor device package includes the heat slug mounted on the board side surface of the ceramic package. A die mount area is formed over or on a top side surface of the heat slug. The ceramic package is a multilayer ceramic structure. Portions of a conductor layer end with bond fingers having a surface exposed next to the die cavity and positioned adjacent the die mount area. At least one semiconductor device is mounted in the die mount area with a backside surface attached to a surface of the heat slug, with active devices and bond pads on the semiconductor device facing away from the surface of the heat slug. In an example, the at least one semiconductor device is a power field effect transistor (FET) device. Electrical connections are made between bond pads on a device side surface of the semiconductor device and the conductive bond fingers of the ceramic package. The electrical connections can be bond wires or ribbon bonds that couple bond pads to the bond fingers. The semiconductor device, the electrical connections, the die cavity and portions of the ceramic package are covered by a lid that is attached to and seals the die cavity. The heat slug has a top side surface that forms the bottom surface of the die cavity, and an exposed board side surface. In the arrangements, the lid is a metal lid that is brazed or soldered to a seal ring formed on the ceramic package, and the package is hermetically sealed.

When the ceramic semiconductor device package is mounted to a printed circuit board, the exposed board side surface of the heat slug can dissipate thermal energy. The semiconductor device is mounted in thermal contact with a top surface of the heat slug. Because the semiconductor device has its backside mounted to or in thermal contact with the heat slug, the thermal dissipation from the packaged semiconductor device is especially efficient.

FIG. 1A illustrates, in a projection top view, a ceramic semiconductor device package 100. The ceramic semiconductor device package 100 can be described as a ceramic flat package (CFP). In the illustrated example, the leads 105 are on two opposite sides of the ceramic semiconductor device package 100 and the package can be described as a dual in line or dual ceramic flat package. The package has leads 105 that are flat leads extending from opposite sides of a ceramic package 107, the leads 105 are brazed or soldered to conductive metal lands (not visible in FIG. 1A, see 111 in FIG. 1B) on the board side surface of the ceramic semiconductor device package 100 (the board side is visible in FIG. 1B). The ceramic package 107 can be of a ceramic dielectric material, in examples alumina (aluminum oxide or $Al_2O_3$) or aluminum nitride (AlN) can be used. Other ceramic materials such as low temperature co-fired ceramic (LTCC) materials can be used. In the example arrangement of FIGS. 1A-1B, a 24 pin ceramic semiconductor device package is used, with the leads 105 extending from opposite sides of the ceramic semiconductor device package 100. A lid 109 is attached to the ceramic package body 107 by a solder or epoxy. The lid 109 can be a copper, copper tungsten, aluminum, or other metal or alloy, and can be plated to protect the lid from corrosion using gold, nickel, silver, palladium or combinations or alloys of these. An example package has a package width PW including the lengths of the leads 105 of about 1.1 inches, or about 28 millimeters, a package length PL of about 0.6 inches of about 15.5 millimeters, and a body width BW of 0.3 inches or about 7.6 millimeters. Other package sizes and other pin count packages can form additional alternative arrangements.

Figure 1B:
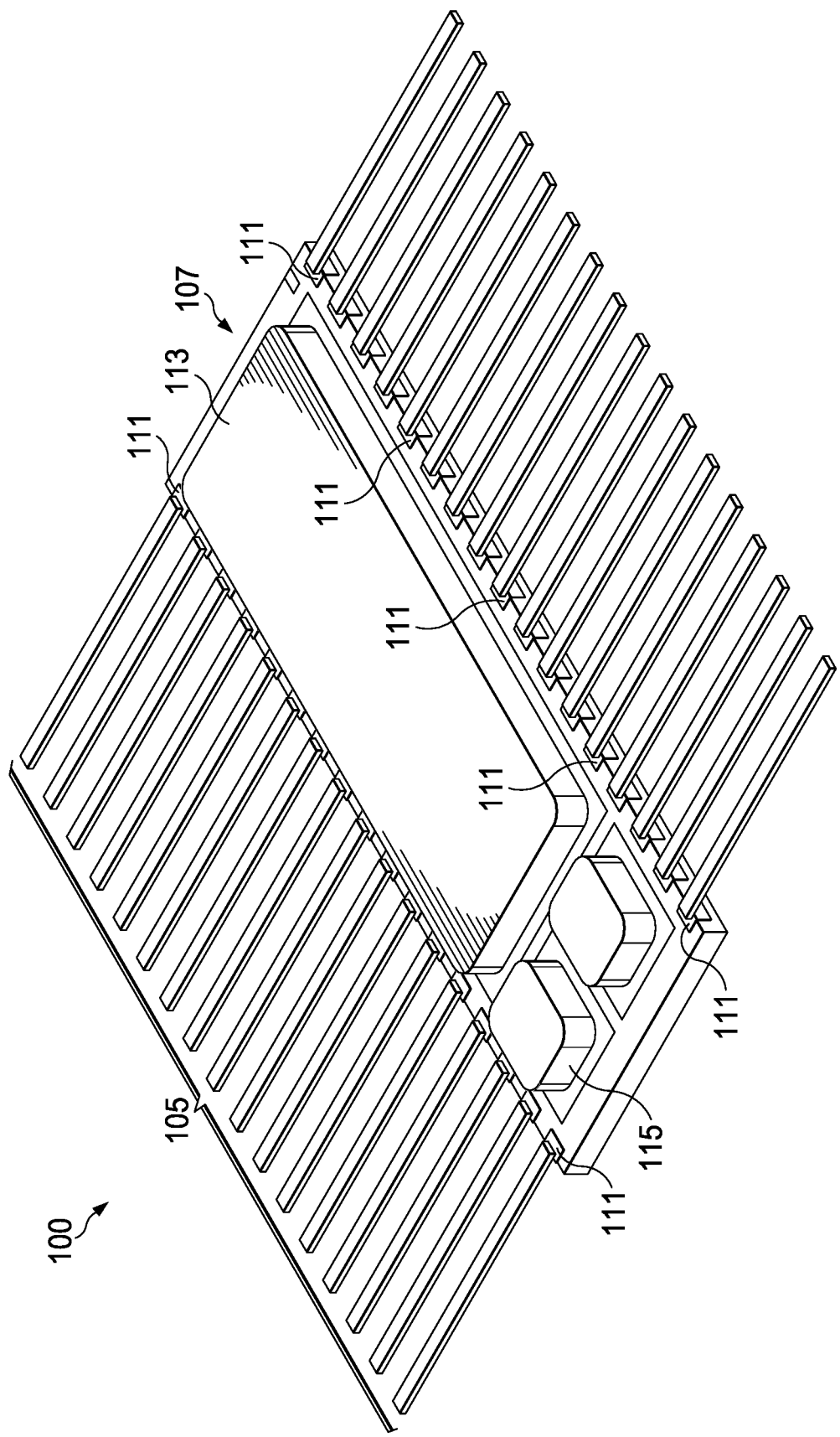
FIG. 1B illustrates in a projection a bottom view of the ceramic semiconductor device package.

FIG. 1B is a bottom side projection view of the ceramic semiconductor device package 100 showing a board side surface. The ceramic package body 107 has leads 105 brazed onto metal lands 111 on the board side surface of the ceramic package body. The lands 111 in the arrangements include board side metal and sidewall metallization, so that the metal lands 111 extend from the board side continuously onto the sidewalls of the ceramic package body 107, to further increase area of the metal land 111 and to reduce resistance. The leads 105 are flat and in an example process a flat surface of the leads 105 is brazed to the board side surface of the metal lands 111. Heat sinks 113 and 115 are shown, in the arrangements a semiconductor device is mounted to and in thermal contact with the heat sink 113, a surface of which forms the bottom surface of a die cavity within the ceramic package body 107 (see FIGS. 3A-3D in cross sectional views). The heat sink 115 can be in thermal contact with a passive device or with an additional semiconductor device mounted in the ceramic semiconductor device package 100. In an example the heat sinks 113, 115 can also be copper tungsten alloy which has a relatively high thermal conductivity. Other thermally conductive materials such as copper can be used.

Figure 1C:
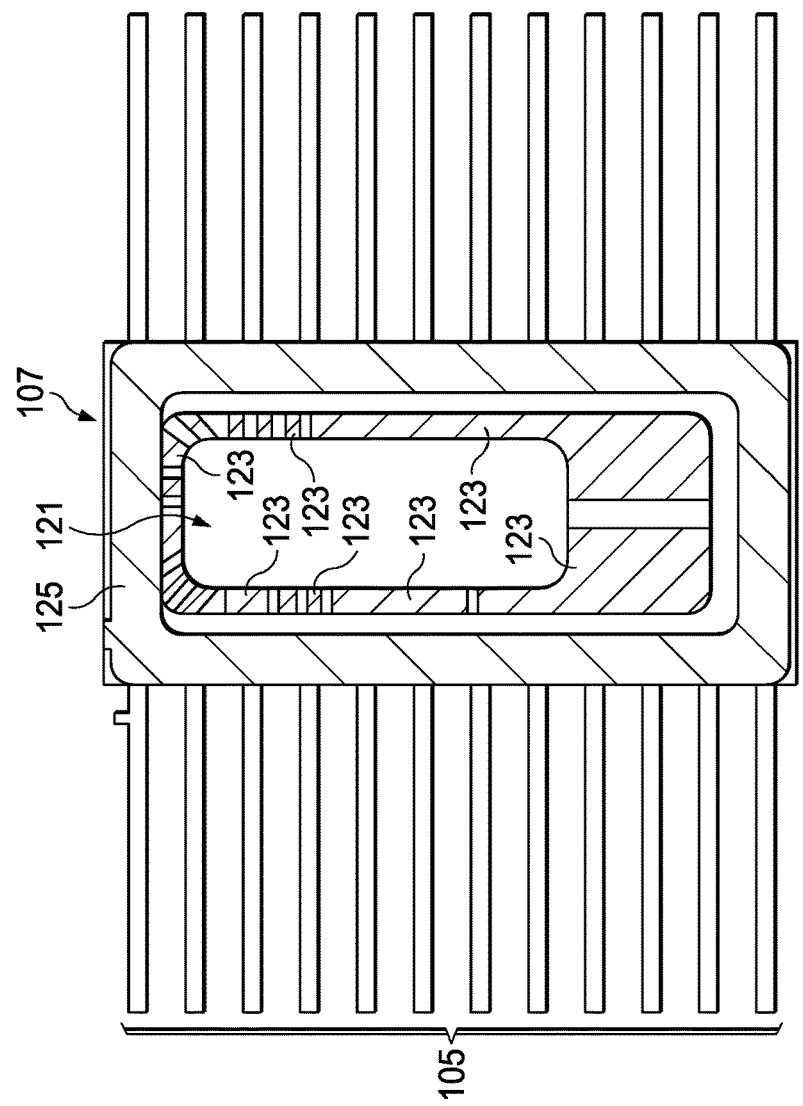
FIG. 1C illustrates in a plan view, a ceramic package substrate for use in an arrangement.

FIG. 1C is a plan view of a ceramic package substrate. The ceramic package body 107, which in an example is formed of alumina, has layers of horizontal conductors formed on laminated layers of ceramic material, with bond fingers 123 extending on one of the layers to be adjacent to a die cavity 121, which is arranged to receive at least one semiconductor device. A seal ring 125 is formed on a top surface of the ceramic package body 107 and is arranged for mounting a lid. In the example, the conductors including the bond fingers 123 are of a copper tungsten alloy (CuW), which can have various combinations of copper and tungsten. The conductors are connected through layers of dielectric by filled vias, in the arrangements the filled vias are filled with molybdenum or a molybdenum alloy. Platings such as gold, nickel, palladium, and silver can be formed on the bond fingers 123 and the seal ring 125 to enhance bonding and prevent corrosion and reduce ion diffusion. As is described below, the ceramic package 107 is used to mount a semiconductor device which is electrically coupled to the bond fingers 123, and the package is sealed using the seal ring 125 to protect the semiconductor device.

Figure 2:
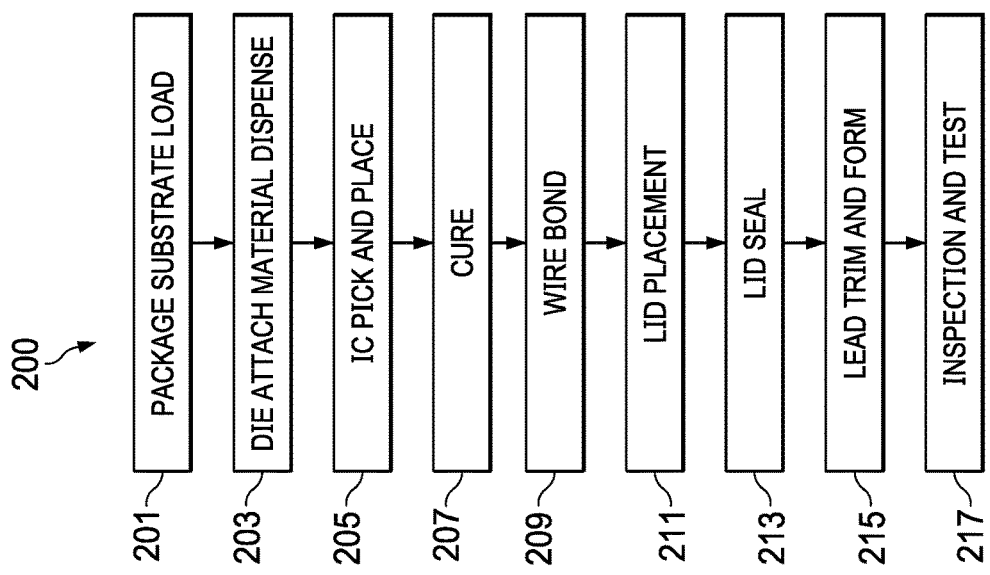
FIG. 2 illustrates, in a flow diagram, selected steps for forming a ceramic semiconductor device package of an arrangement.

FIG. 2 is a flow diagram that illustrates selected steps used to form an arrangement. At step 201, ceramic package substrates are loaded into a tool or fixture such as a pick and place tool. The ceramic package substrates can be provided singly or in a strip or array. Each ceramic package substrate has a ceramic package (see 107 of FIG. 1C) mounted to conductive leads that are also temporarily supported and connected by a lead frame. A heat slug or heat sink is attached to a board side surface of the ceramic package, and a surface of the heat slug forms the bottom of a die cavity in the ceramic package body, a portion of the heat sink is a die mount area arranged for mounting a semiconductor device. In the arrangements, conductors within dielectric layers in the ceramic package are formed of copper tungsten alloy (CuW) which has a low sheet resistance. The conductor layers can extend to a side of the ceramic package and contact a side metallization to further reduce resistance.

At step 203, die attach material is dispensed onto the die mount area. The die attach material can be a paste, tape, or film, and is thermally conductive. At step 205, a pick and place tool picks up a semiconductor device for each of the ceramic package substrates and places it on the die attach material. At step 207, the die attach material is cured to fix the semiconductor devices in the ceramic package body for each package substrate. At step 209, wire bonding is performed to electrically connect bond pads on the semiconductor device to the bond fingers of the ceramic package substrate. In an alternative approach, ribbon bonds can be used. In an example wire bonding process, a wedge bonding process forms a wedge bond on the bond pads of the semiconductor device, and the bond wire is allowed to extend from the bond pad to a bond finger, where a second wedge bond is formed. A cutting tool then breaks the end of the bond wire past the wedge bond and sets up the bonding tool for a new wedge bond. This process can be repeated at high speed to quickly form wire bonds between the bond pads and the bond fingers for each semiconductor device package. Wedge bonds using gold bond wire can use thermal and sonic energy to form the bonds, while wedge bonds using aluminum wire use ultrasonic energy. Ball and stitch bonds can be formed using a wire bonding tool. In ball and stitch bonding, a free end of a bond wire extends through a capillary of the wire bonding tool. Flame or thermal energy is applied to the end of the bond wire to form a free air ball. The ball is bonded to a bond pad on the semiconductor device using pressure, vibration, or thermal energy, or a combination of these in an ultrasonic or thermasonic bonding process. The capillary is moved away from the bond pad, the bond wire extending from the ball bond and forming an arc or curved shape. The capillary carries the extending wire to a bond finger, where a "stitch" bond is formed using pressure. The tool then cuts the wire past the stitch bond to complete the wire bond and the process repeats. Bonding tools can bond devices to packages at very high speeds, are fully automated, and can move from device to device at a single station for high throughput.

At step 211, the ceramic semiconductor device package is complete and a lid can be placed and attached. The seal ring of the ceramic package (see 125 in FIG. 1C) can be a copper, copper tungsten, copper alloy or other metal. In an example the seal ring is formed of the same material as the conductors, copper tungsten alloy. By using a lid of a similar metal or alloy, thermal properties between the materials are similar and stress due to coefficient of thermal expansion (CTE) mismatch can be reduced. In an arrangement the lid is of copper tungsten and is preplated with a gold tin (AuSn) layer for soldering to the seal ring. After the lid is placed and sealed at step 213 in FIG. 2, the ceramic semiconductor device package is now complete, and the leads can be separated from one another and the from the supportive lead frame portions, at step 215, "Lead Trim and Form". In various package types, the leads can be left straight, or can be shaped for surface mounting. Gull wing, J-lead, and other shapes can be used.

At step 217 the method 200 ends with inspection and test steps, machine vision can be used for automated visual inspection (AVI), human visual inspection can be performed, and functional testing can be performed by use of a test fixture to exercise the semiconductor device within the ceramic semiconductor device package.

FIGS. 3A-3E illustrate, in a series of cross sectional views, selected steps of the method of FIG. 2. At FIG. 3A, a ceramic package substrate 300 is shown ready for device mounting (see step 201 of FIG. 2). A ceramic package 107 is shown with leads 105 attached to a board side surface 301. The leads 105 are attached to metal lands on the board side surface 301 (not visible in FIGS. 3A-3D) and the metal lands include side metallization (also not visible in FIGS. 3A-3D, see FIG. 4) that extends to the sides 303 of the ceramic package 107. A heat sink or heat slug 113 is mounted to the ceramic package 107 and has a board side surface 305 and an opposing top side surface 307. The top side surface 307 of the heat slug 113 forms the bottom of a die cavity 121 that extends through the ceramic package 107. Ceramic package 107 has four vertical sides, a first, second, third, and fourth vertical side, that extend between the board side surface 301 and an opposite top side surface.

The ceramic package 107 has layers 309 of dielectric material that are laminated one over another to form the ceramic package 107. The ceramic package 107 can be formed in a thermal co-fire process. In an example process, a slurry of ceramic material, such as alumina, is mixed and forms a film or tape. The film or tape can be supported by a frame for handling. Vias for vertical signals extending through the layers, and openings of cavities, can be formed by laser cutting or mechanical cutting or punches. The vias can be filled with a via conductor in a paste form. In an example arrangement, the paste can be a molybdenum or an molybdenum alloy. Screen printing can be used to form conductor patterns, using a conductive paste. In the example arrangements, a copper tungsten (CuW) alloy is used for the conductors, which has a low sheet resistance compared to other alternative conductors such as tungsten. The tape portions can be stacked to form the desired layers. A thermal process of co-firing then hardens the ceramic and simultaneously converts the pastes into metal conductors that are spaced by the dielectric layers, with the filled vias connecting the horizontal conductors through the dielectric layers.

In FIG. 3A, copper tungsten alloy conductors 311 are shown and bond fingers 123 are shown formed of one of the conductor layers. The vias are not visible in FIG. 3A, (see FIG. 4). In an example arrangement, some layers of the ceramic package 107 include embedded copper tungsten alloy conductor rails 315, which can fill a vertical opening or trench in a dielectric layer and form vertically connected low resistance planes or rails, such as for power or ground signals that carry substantial current. In an arrangement, the embedded copper tungsten conductor rails are formed using conductive paste in the same manner as the conductor layers.

FIG. 3B illustrates the ceramic package substrate 300 of FIG. 3A after a die attach material 317 is dispensed in the die cavity (see FIG. 2, step 203). The die attach material is a thermally conductive die attach and can be a film, liquid or paste. Drop on demand or ink jet dispensing can be used, or a syringe or needle can be used to deposit the die attach material.

Figure 3C:
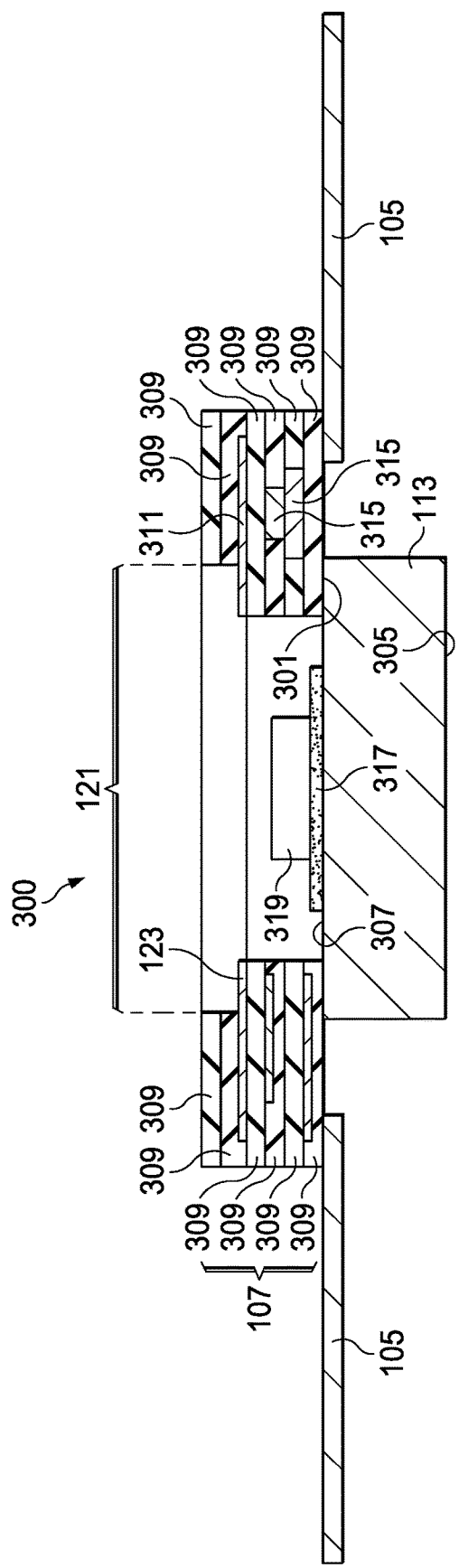

FIG. 3C illustrates the ceramic package substrate 300 of FIG. 3B after a semiconductor device is placed on the die attach material and a cure step is completed (see FIG. 2, steps 205, 207). The semiconductor device 319 is shown mounted on the heat slug 113 by die attach material 317. By placing the semiconductor device 319 in thermal contact with the heat slug 113, the ceramic semiconductor device package allows efficient dissipation of thermal energy from the semiconductor device 319. In an example arrangement the semiconductor device 319 is a power device, such as a power FET.

Figure 3D:
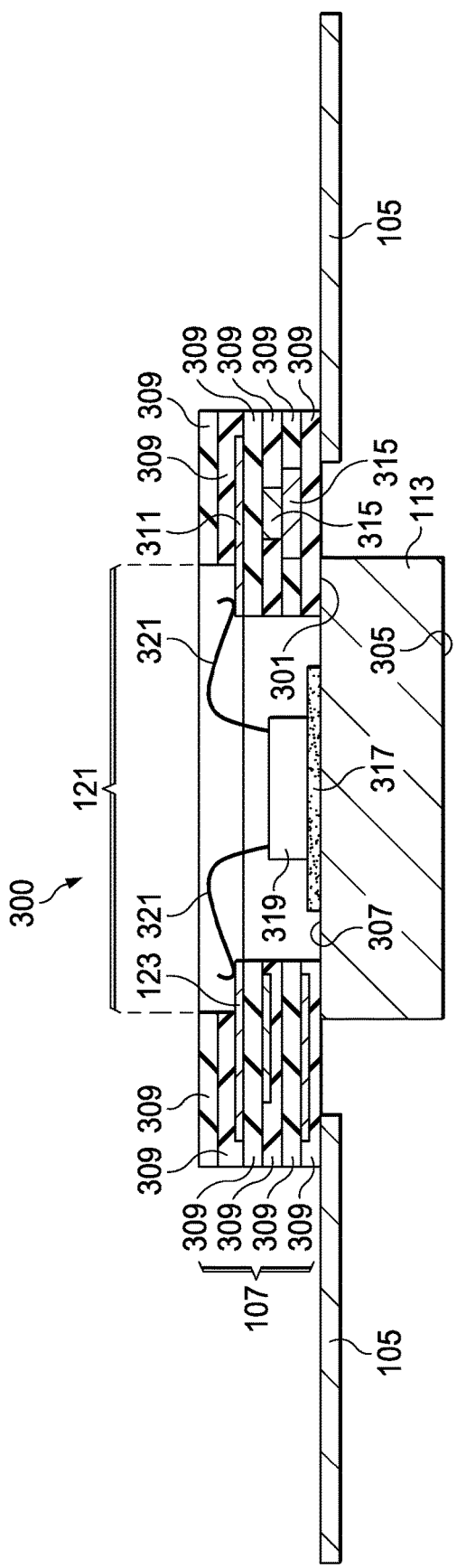

FIG. 3D illustrates the ceramic package substrate 300 of FIG. 3C after a wire bonding process (see step 209 of FIG. 2). In an example arrangement, a wedge bonding process is used. In an alternative arrangement, ball and stitch bonding is used. Ribbon bonds can be used instead of bond wires. The bond wires can be gold, copper, palladium coated copper (PCC), or aluminum. The wire bonds 321 extend from bond pads on the semiconductor device 319 to bond fingers 123. The bond wires 321 electrically couple the semiconductor device 319 to the conductor layers 311 and to the leads 105 by the combination of the conductor layers 311 and filled vias that couple signals through the ceramic package 107 to the leads 105. For signals such as ground and power that may carry high currents or high voltage, resistance is lowered by forming parallel bond wires 321 from the semiconductor device to the bond fingers 123.

Figure 3E:
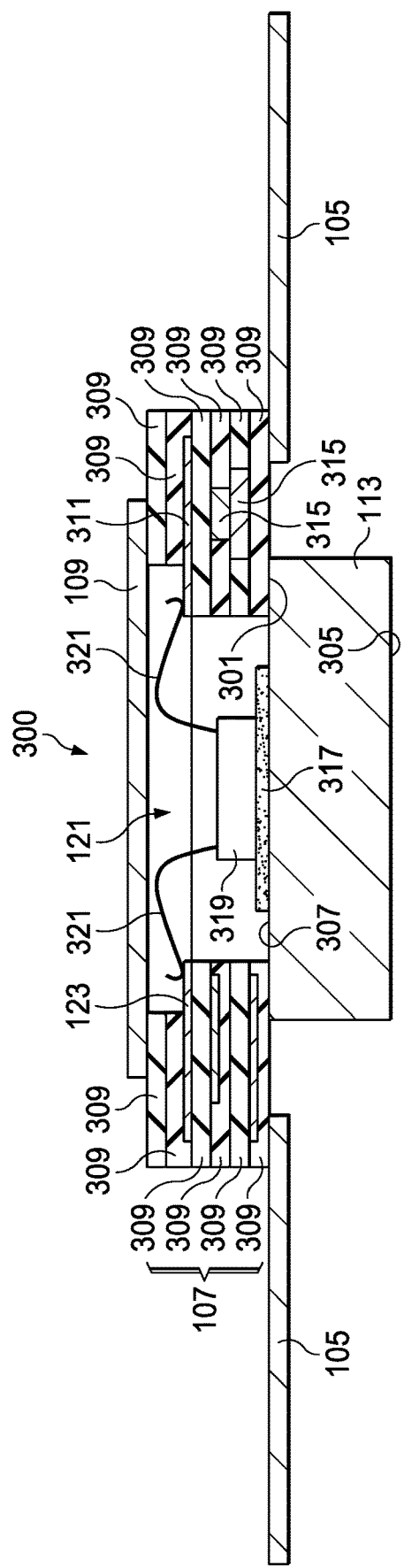

FIG. 3E illustrates, in another cross section, the ceramic package substrate 300 after the lid is 109 placed and sealed (see steps 211 and 213 in FIG. 2). In an example arrangement the lid can be of a metal such as aluminum, copper, copper tungsten alloy or another alloy of copper, or of lead frame materials such as iron nickel or iron nickel cobalt alloys. The lid can be plated to reduce corrosion and avoid tarnish with a plating such as nickel, gold, palladium, tin or combinations of these.

After the steps shown in FIG. 3E, the ceramic package is complete and the individual unit ceramic semiconductor device packages (see 100 in FIG. 1A) can be removed from any remaining lead frame supports, and the leads 105 can be trimmed and formed. Test and inspection steps (see 215, 217 in FIG. 2) can be completed on the devices.

Figure 4:
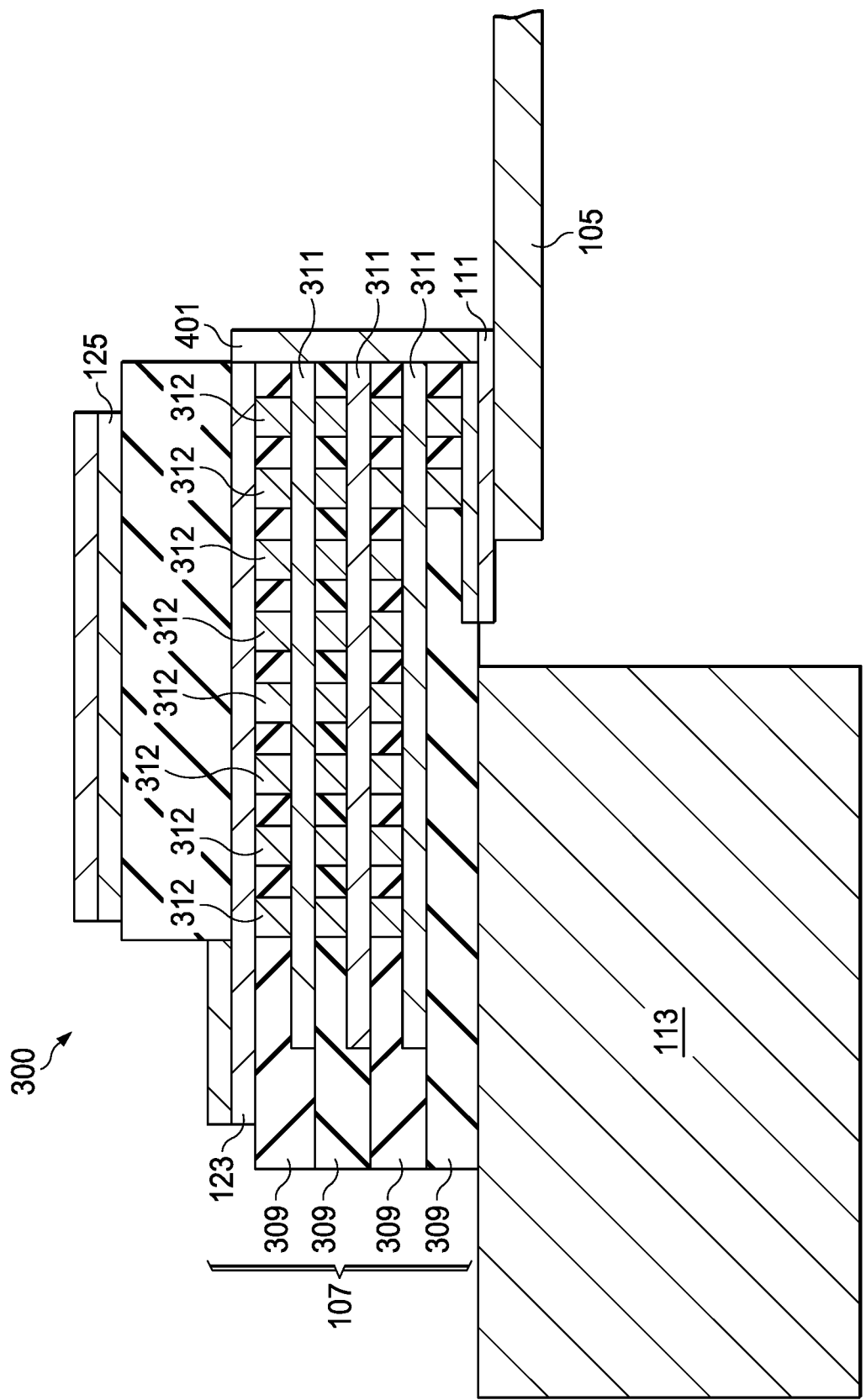
FIG. 4 illustrates, in a close up view, details of a portion of a ceramic semiconductor device package of an arrangement.

FIG. 4 illustrates, in an additional cross sectional view, additional details of the ceramic package devices of the arrangements. In FIG. 4, the ceramic package substrate 300 has ceramic package 107 shown in a close up cross section with heat slug 113 attached to a board side surface. The dielectric layers 309 are shown with conductor layers 311 and vias 312 vertically connecting the conductor layers 309 through the dielectric layers 309. Seal ring 125 is shown on a top side surface of the ceramic package 107 and a bond finger 123 is shown with an exposed surface for wire bonding. The seal ring 125 and bond fingers 123 are plated, for example with gold and nickel, to enhance bonding and prevent corrosion and reduce ion diffusion. Sidewall metallization 401 extends from the metal land 111 on the board side surface of ceramic package 107. The lead 105 is shown brazed to the metal land 111. By using a flat lead 105 that is making contact to the metal land 111, the resistance of the path from the bond finger 123 to the lead 105 is reduced and device performance is enhanced. In additional arrangements, embedded conductor rails (see FIG. 3D, 315) can also be used to further reduce resistance between the semiconductor device and the leads 105.

The use of the arrangements including a ceramic package with copper tungsten conductors, straight leads brazed onto a metal land on a board side surface with additional side metallization, and the conductor layers reduces the resistance of a semiconductor device package. Reduced resistance is particularly important for power FET ceramic semiconductor device packages. In an example, the reduced resistance allowed a power FET semiconductor device to be packaged in a lower pin count package (24 instead of 36 pins), while resistance on the ground net was reduced by about 50% from 16.8 to 8.9 mOhm, and resistance on other signals was similarly reduced. A figure of merit (FOM) of amps/mm2 for the package was increased by 43% by use of the arrangements to form a 24 pin ceramic semiconductor device package, when compared to a prior ceramic package with 34 pins used for the same semiconductor device. Inductance in the package was also reduced by use of the copper tungsten conductors. Area was reduced by 30% over the prior package.

Use of the arrangements provides a ceramic semiconductor device package with reduced resistance, reduced inductance and enhanced thermal dissipation, without changes to the design of the semiconductor devices, while using existing lead patterns and package body sizes. The arrangements are formed using existing methods, materials and tooling for making the devices and are cost effective.

Modifications are possible in the described arrangements, and other alternative arrangements are possible within the scope of the claims.

What is claimed is:

1. An apparatus, comprising:
   a ceramic package having a board side surface and an opposite top side surface, and having a first side, a second side, a third side and a fourth side, the first, second, third and fourth sides extending between the board side surface and the opposite top side surface;
   a heat slug having a board side surface and an opposite top side surface, the heat slug mounted to the board side surface of the ceramic package, a surface of the heat slug covering a die cavity formed in the ceramic package and forming a bottom surface in the die cavity;
   leads mounted to conductive lands on the board side surface of the ceramic package, the leads having a flat surface attached to the conductive lands;
   sidewall metallization extending from the conductive lands on the board side surface and covering a portion of one of the first, second, third and fourth sides of the ceramic package;
   conductor layers formed in the ceramic package and spaced by dielectric layers in the ceramic package, the conductor layers comprising a copper tungsten alloy, the conductor layers forming horizontal conductors within the ceramic package;
   filled vias extending through the dielectric layers between the conductor layers, and electrically coupling some of the conductor layers;
   bond fingers formed of a conductor layer and extending to the die cavity, the bond fingers having an exposed surface;
   at least one semiconductor device having a backside surface mounted to the top side surface of the heat slug, the at least one semiconductor device having bond pads on a device side surface facing away from the top side surface of the heat slug;
   electrical connections coupling bond pads of the at least one semiconductor device to the exposed surface of the bond fingers; and
   a lid mounted to the opposite top side surface of the ceramic package and covering the die cavity, the at least one semiconductor device and the electrical connections.

2. The apparatus of claim 1, wherein the filled vias comprise molybdenum or a molybdenum alloy.

3. The apparatus of claim 2, and further comprising embedded copper tungsten conductors that extend through openings in the dielectric layers between ones of the conductor layers.

4. The apparatus of claim 1, wherein at least one of the conductor layers extends through one of the sides of the ceramic package and contacts the sidewall metallization on the ceramic package.

5. The apparatus of claim 1, wherein the electrical connections comprise wire bonds or ribbon bonds.

6. The apparatus of claim 1, wherein the ceramic package further comprises a ceramic package body that ties the leads together.

7. The apparatus of claim 6, wherein the leads comprise copper, stainless steel, steel, iron nickel alloy, iron nickel cobalt alloy, or alloys thereof.

8. The apparatus of claim 1, wherein the heat slug comprises copper, copper tungsten alloy, gold, aluminum, stainless steel, steel, iron nickel alloy, iron nickel cobalt alloy, or alloys thereof.

9. The apparatus of claim 1, wherein the ceramic package further comprises aluminum oxide or aluminum nitride.

10. The apparatus of claim 1, wherein the semiconductor device further comprises a power FET semiconductor device.

11. The apparatus of claim 10, and further comprising a passive device configurable to be mounted to the top side surface of the heat slug within the die cavity and configurable to be coupled to the power FET semiconductor device.

12. The apparatus of claim 1, wherein the leads are electrically coupled to the sidewall metallization of the ceramic package.

13. The apparatus of claim 1, wherein the conductive lands and the leads are plated with nickel, gold, palladium, silver, or combinations thereof.

* * * * *